United States Patent
Dzienis et al.

(10) Patent No.: US 10,976,357 B2
(45) Date of Patent: Apr. 13, 2021

(54) METHOD AND DEVICE FOR DETERMINING A FAULT LOCATION OF A GROUND FAULT RELATING TO A LINE OF A THREE-PHASE ELECTRICAL ENERGY SUPPLY NETWORK HAVING A NEUTRAL POINT WITHOUT LOW-RESISTANCE GROUNDING

(71) Applicant: SIEMENS AKTIENGESELLSCHAFT, Munich (DE)

(72) Inventors: Cezary Dzienis, Dallgow-Doeberitz (DE); Andreas Jurisch, Schwante (DE)

(73) Assignee: Siemens Aktiengesellschaft, Munich (DE)

( * ) Notice: Subject to any disclaimer, the term of this patent is extended or adjusted under 35 U.S.C. 154(b) by 509 days.

(21) Appl. No.: 15/874,193

(22) Filed: Jan. 18, 2018

(65) Prior Publication Data
US 2018/0203056 A1  Jul. 19, 2018

(30) Foreign Application Priority Data
Jan. 18, 2017 (EP) ..................... 17151996

(51) Int. Cl.
*G01R 31/08* (2020.01)
*G01R 31/02* (2006.01)
(Continued)

(52) U.S. Cl.
CPC ......... *G01R 31/086* (2013.01); *G01R 19/165* (2013.01); *G01R 31/08* (2013.01); *G01R 31/50* (2020.01)

(58) Field of Classification Search
CPC .... G01R 31/086; G01R 31/024; G01R 31/08; G01R 31/025; G01R 19/165
See application file for complete search history.

(56) References Cited

U.S. PATENT DOCUMENTS

| | | | |
|---|---|---|---|
| 4,996,624 A | 2/1991 | Schweitzer, III | |
| 5,929,642 A | 7/1999 | Philippot et al. | |
| | (Continued) | | |

FOREIGN PATENT DOCUMENTS

| | | |
|---|---|---|
| EP | 2476002 B1 | 5/2015 |
| WO | 2012126526 A1 | 9/2012 |

OTHER PUBLICATIONS

Daniel Patynowski, et al.; "Fault Locator approach for high-impedance grounded or ungrounded distribution systems using synchrophasors"; 68th Annual Conference for Protective Relay Engineers, 2015; pp. 302-310; IEEE; XP032774097; DOI: 10.1109/CPRE.2015.7102173.
(Continued)

*Primary Examiner* — Regis J Betsch
*Assistant Examiner* — Jeremy A Delozier
(74) *Attorney, Agent, or Firm* — Laurence Greenberg; Werner Stemer; Ralph Locher

(57) ABSTRACT

A method for determining the fault location of a ground fault relating to a line of a three-phase electrical energy supply network with an ungrounded neutral point, in which current and voltage values are measured at one line end of the line. Following the occurrence of a ground fault on the line, the location of the fault is defined using the measured current and voltage values. The measured current and voltage values are converted into α-components and 0-components of a Clarke transformation, a location-dependent characteristic function of α-component and 0-component fault voltage values is defined in each case using the converted components and a propagation model for travelling waves on the line. The fault location is determined to be the location at which the two characteristic functions exhibit the closest match.

18 Claims, 11 Drawing Sheets

(51) Int. Cl.
*G01R 19/165* (2006.01)
*G01R 31/50* (2020.01)

(56) References Cited

U.S. PATENT DOCUMENTS

| | | | |
|---|---|---|---|
| 8,655,609 B2 | 2/2014 | Schweitzer, III | |
| 2011/0098951 A1* | 4/2011 | Jurisch | H02H 3/305 702/58 |
| 2013/0096854 A1* | 4/2013 | Schweitzer, III | G01R 31/085 702/59 |

OTHER PUBLICATIONS

Marcel Istrate, et al; "Assessment of fault location algorithms in transmission grids"; 2009 IEEE Bucharest Power Tech Conference; 2009; pp. 1-6; IEEE; Piscataway, NJ, USA; XP031543071; ISBN: 978-1-4244-2234-0.

* cited by examiner

METHOD AND DEVICE FOR DETERMINING A FAULT LOCATION OF A GROUND FAULT RELATING TO A LINE OF A THREE-PHASE ELECTRICAL ENERGY SUPPLY NETWORK HAVING A NEUTRAL POINT WITHOUT LOW-RESISTANCE GROUNDING

CROSS-REFERENCE TO RELATED APPLICATION

This application claims the benefit, under 35 U.S.C. § 119, of European patent application EP 17151996.0, filed Jan. 18, 2017; the prior application is herewith incorporated by reference in its entirety.

BACKGROUND OF THE INVENTION

Field of the Invention

The invention relates to a method for determining the fault location of a ground fault relating to a line of a three-phase electrical energy supply network having a neutral point without low-resistance grounding, in which current and voltage values are measured at one line end of the line and, following the occurrence of a fault on the line, the fault location of said fault is defined using the measured current and voltage values. The invention also relates to a corresponding device for determining the fault location of a ground fault.

The safe operation of electrical energy supply networks requires the reliable detection and shutdown of any faults such as, for instance, ground faults. Causes of faults resulting in a shutdown may, for example, be lightning strikes, torn or otherwise damaged lines, defective insulations in cable lines or the unwanted contact with overhead lines by animal or plant parts. In order to shorten fault-related downtimes, faults of this type must be localized as accurately as possible in order to enable an elimination by a maintenance team of the fault cause and any consequential damage caused by the fault.

Networks without low-resistance grounding are usually operated at the distribution level of an energy supply system. Depending on the geographical size of the distribution level, these networks are used in two variants, on the one hand with an isolated neutral point in which no connection whatsoever of the neutral point to ground is present, and, on the other hand, with a compensated neutral point in which the neutral point is connected via an inductor to ground. The expression "ungrounded" is to be understood below in the described sense to mean "without low-resistance grounding".

The advantage of ungrounded networks is that their continued operation is essentially allowed during a ground fault and therefore no interruption of the energy supply occurs from the network to loads supplied with electrical energy. In addition, ground faults usually extinguish themselves, so that no switching action is required.

Regardless of whether the ground fault persists for a long time or extinguishes itself, the fault location, i.e. the position on the line where the ground fault has occurred, must be identified and checked by a maintenance crew in order to detect and repair any mechanical damage. An unrepaired ground fault position may in fact also result in a mechanical weakening which may extend to a permanent short circuit in the case of an unwanted network state (e.g. a voltage increase).

In order to identify the ground fault positions, a fault location mechanism is required which outputs the fault location as a result, e.g. as a distance of the ground fault position from a measuring device. This position is visited by a maintenance team and investigated for possible damage. The more accurately the fault location is carried out, the lower the costs for locating and analyzing the fault-affected position.

In the simplest, but also most expensive, case, a fault is located by way of visual inspection. The maintenance crew passes along the defective line and examines it for visible fault points. That procedure is slow and prone to error.

In the case of permanent ground faults, a check can additionally be carried out through the short-term shutdown of lines to determine whether the displacement voltage in the network disappears following the shutdown of a line. This procedure is continued until the fault-affected line has been found. These search switching operations are costly and cause supply failures during the test shutdowns.

A different procedure has therefore largely been adopted, whereby the fault location at which the fault on the line is located is isolated by means of an analysis of measurement values, e.g. currents and voltages measured during the fault occurrence. A plurality of different methods have since become known for this purpose, the accuracy of which impacts significantly on the maintenance cost of the energy supply network. Great importance is therefore attached to improving the accuracy of the algorithms used for the fault location in order to simplify the maintenance and, in particular, shorten fault-related downtimes of the energy supply network.

A rough result of the fault location can be achieved, for example, by identifying the fault direction. This method is used primarily in compensated, isolated and high-impedance-grounded energy supply networks with a radial structure or a low degree of meshing. A wattmetric method, for example, can be used, as known from the European Patent EP 2476002 B1. A different method for detecting the fault direction is the "transient relay principle" which is known in one possible embodiment, for example, from the international patent application WO 2012/126526 A1. However, an additional evaluation is necessary in these methods for more accurate fault location.

Methods for more accurate fault location use, for example, the measured current and voltage signals of the fundamental wave (50 Hz or 60 Hz signals) for fault location. Here, methods are known which use measured values of only one of the line ends (single-ended fault location) or measured values of both line ends (double-ended fault location). As a result, the fault location is normally indicated as the distance from the respective measuring point (as a percentage of the line or in km or miles).

In the case of the use of measured values of only one line end, the cost of performing the fault location is low. This fault location method is primarily an impedance-based method in which an impedance through to the fault location is calculated from current and voltage measured values. The fault location can be inferred through comparison with the line impedance of the entire line in the fault-free case. An example embodiment of a fault location method of this type can be found, for example, in U.S. Pat. No. 4,996,624.

The accuracy of this method depends, inter alia, heavily on the measurement accuracy of the current and voltage transformers that are used, the accuracy of the line parameters used for the fault location (e.g. impedance per unit length) and on the given fault conditions (e.g. fault resistance, load) and the network characteristics. Faults and the transient responses in the current and voltage signals can have a negative impact on the accuracy of this method. The resulting measurement errors may amount to several percent.

An improved accuracy in the fault location can be achieved through the use of measured values from both line ends. Here, the fault-location-related measured values must be collated via a suitable communication connection. In this context, reference is made to U.S. Pat. No. 5,929,642; in the method described there, a fairly high accuracy (measurement error approximately 1-2%) is achieved in the fault location using current and voltage measured values from both line ends by means of estimation methods and non-linear optimization methods.

Since very low ground fault currents which are normally overlaid with significantly higher operating currents occur in ungrounded networks, they can only be located with difficulty using conventional methods for single-ended fault location. In suppressed networks, ground fault currents are compensated with arc suppression coils. In addition, the ground fault duration of non-permanent ground faults (also referred to as transient ground faults) is less than one cycle duration, thus substantially hindering the accurate determination of electrical variables during the fault, e.g. in the form of complex current or voltage indicators. The existing transients in the measured variables also contribute to the impossibility of correctly determining fundamental oscillation components. As a result, the fault location is relatively inaccurate.

An improvement in the result can be achieved by using a double-ended fault location method. However, the installation of measuring devices at both line ends is required for this purpose, wherein the measuring devices must be able to communicate with one another. In many networks which are geographically unfavorably located, this communication is not always guaranteed.

Whereas the accuracy of the fault location in the case of impedance-based fault location methods depends on the measurement accuracy of the measuring transformers that are used and the network characteristics, a broad independence from these values can be achieved through the use of a fault location method according to the "travelling wave fault location" principle. According to this principle, the transient signal components produced in the event of a fault and occurring in the form of "travelling waves" are taken into consideration for the fault location instead of the measured current and voltage signals. Here, the high-frequency travelling wave edges are measured and provided with a timestamp. Since the propagation speed of the travelling waves is approximately equal to the speed of light, the fault can be accurately located from the evaluation of the timestamping. Accuracies in the region of a few dozen meters can be achieved with this fault location method. An example of a fault location method of this type can be found in U.S. Pat. No. 8,655,609 B2. In the known method, a fault location takes place through measurement at both line ends. A high-precision temporal synchronization between the measuring devices at both line ends must be provided for this purpose, so that uniform timestamps can be allocated. Receivers, for example, of a satellite-based time pulse (e.g. a GPS signal) are necessary here for providing a time signal that is synchronous at both ends.

SUMMARY OF THE INVENTION

It is accordingly an object of the invention to provide a method and device which overcome the above-mentioned and other disadvantages of the heretofore-known devices and methods of this general type and which are able to perform a fault localization process comparatively simply but with high precision in ungrounded networks.

With the foregoing and other objects in view there is provided, in accordance with the invention, a method for determining the fault location of a ground fault relating to a line of a three-phase electrical energy supply network with an ungrounded neutral point. The novel method comprises:

measuring current and voltage values at a line end of the line; and following an occurrence of a ground fault on the line, determining a fault location of the ground fault by:

converting the measured current and voltage values using a Clarke transformation into α-components and 0-components of the Clarke transformation;

defining a location-dependent characteristic function of α-component fault voltage values using the current and voltage values converted into the α-component and a propagation model for travelling waves on the line;

defining a location-dependent characteristic function of 0-component fault voltage values using the current and voltage values converted into the 0-component and a propagation model for travelling waves on the line;

determining a matching of the two characteristic functions for different selected locations on the line; and defining a selected location where the two characteristic functions exhibit a closest match as the fault location of the ground fault on the line.

In other words, the objects of the invention are achieved in that the measured current and voltage values are converted using a Clarke transformation into α-components and 0-components of the Clarke transformation, a location-dependent characteristic function of α-component fault voltage values is defined using the current and voltage values converted into the α-component and a propagation model for travelling waves on the line, a location-dependent characteristic function of 0-component fault voltage values is defined using the current and voltage values converted into the 0-component and a propagation model for travelling waves on the line, the matching of the two characteristic functions for different selected locations on the line is determined, and the selected location where the two characteristic functions reveal the closest match is defined as the fault location of the ground fault on the line.

The method according to the invention advantageously requires measured values from one line end only, as a result of which a complex communication and time synchronization between measuring devices on both line ends is eliminated. For this purpose, the invention takes advantage of the realization that the signals of the α-component and those of the 0-component propagate at a different propagation speed along the line and therefore have a different propagation coefficient. Due to the difference in the propagation speed of the signals of the two components, the fault location can be defined at one line end, since there is only one single location at which the characteristic functions of the two fault voltage values match one another. The location for which the two characteristic functions of the fault voltage values reveal the closest match is regarded as the fault location of the ground fault.

In this application, the expressions "fault location" and "distance x (or l-x) of the fault location from a line end" are used partially synonymously and are to be understood accordingly.

According to one advantageous embodiment of the method according to the invention, it is provided that the closest match of the two characteristic functions is determined through optimization of a target function, wherein the selected location on the line is used as the optimization variable for the target function.

As a result, the actual fault location can be determined at an acceptable processing cost through mathematical optimization (e.g. a minimization of the target function).

It can specifically be provided, for example, that the location for which a minimum of the difference between the two characteristic functions occurs is defined with the target function as the fault location.

The target function may represent, for example, the simple or quadratic difference between the two characteristic functions. With mathematically relatively simple means, a minimization results in the global minimum of the target function which indicates the actual fault location.

In this context, it can be provided according to one advantageous embodiment that, in the formation of the target function, frequency-dependent amplitude and/or phase angle errors can be taken into account by measuring transformers used to measure the current and voltage values.

As a result, the respective transmission behavior of the transformers used to measure the current and voltage values can particularly advantageously be taken into account, so that frequency-dependent transmission errors can be eliminated in the formation of the target function. Frequency-dependent amplitude and phase angle errors can normally be found in the technical datasheets of the respective measuring transformers and are therefore known.

Specifically, it can furthermore be provided that an iterative optimization method, for example a simplex downhill method, is used for the optimization.

Iterative optimization methods are particularly suitable for determining global minima of target functions. The simplex downhill method furthermore has good convergence characteristics and manages without complex derivations of the target functions.

According to a further advantageous embodiment of the method according to the invention, it is provided that the measured current and voltage values are also converted using the Clarke transformation into β-components of the Clarke transformation in each case with one phase as the reference phase, the β-components of the current and/or voltage measured values of the individual phases are compared with one another, and the phase for which the β-components of the current and/or voltage measured values measured before the fault occurrence compared with the β-components of the current and/or voltage measured values measured after the fault occurrence reveal the smallest change is determined as affected by the ground fault.

In this way, a detection of the phase affected by the ground fault can also be carried out at comparatively low cost. The phase for which the change minimum has been determined by means of the β-component is then used as the reference phase to determine the α-component and the 0-component. This embodiment of the invention is based on the realization that the fault components of the ground fault are essentially reflected in the α-component and the 0-component of the Clarke transformation, whereas the β-component is merely influenced by the load current. This behavior results directly from the essential nature of the Clarke transformation. If, for example, phase A is assumed to be the reference phase and a ground fault occurs in this phase A, no contribution to the ground fault is evident following transformation into the Clarke-components in the β-component of phase A, so that no (or virtually no) change occurs in terms of an observation of the β-component before and after the fault occurrence.

The β-component can thus be used for the reference phase definition. On the basis of this evaluation, the fault-affected phase can always be defined as the reference phase, so that the actual fault location can take place on the basis of the solely present α- und 0-components.

In this context, it can specifically be provided that the fault location is defined only for the phase affected by the ground fault.

In this way, the processing costs for determining the fault location can thus be restricted to the phase actually affected by the fault, as a result of which the efficiency of the entire method increases.

According to a further advantageous embodiment of the method according to the invention, it can furthermore be provided that the current and voltage measured values converted into the α-component and into the 0-component of the Clarke transformation are subjected to a transformation into the frequency range, and the definition of the fault location is carried out within a selected frequency range which is higher than the network frequency of the energy supply network.

In this way, the fault location definition can be carried out with highly accurately with those transient components of the current and voltage signals which are most suitable for determining the fault location. The conversion of the current and voltage values into the frequency domain can be performed, for example, by means of a numerical Fourier transformation (Fast Fourier Transformation, FFT; Discrete Fourier Transformation, DFT).

It can specifically be provided here that the selected frequency range comprises band-limited transient components of the α-component and the 0-component of the measured current and voltage values, preferably a frequency range from 600 Hz to 15 kHz.

The selected frequency should be defined in such a way that, on the one hand, the transformers for measuring the current and voltage values reveal a good transmission behavior and, on the other hand, the energy content of the current and voltage values is sufficiently high to perform the analysis reliably.

A further advantageous embodiment of the method according to the invention provides that the measured current and voltage values are subjected to a filtering before the performance of the Clarke transformation, wherein a low-pass filter is used as the filter.

As a result, the signal to be transformed is already bandwidth-limited and excessively high frequency components in ranges in which the transformers have a poor transmission characteristic are masked from the outset.

According to one further advantageous embodiment of the method according to the invention, it is provided that the line is continuously monitored for the occurrence of a ground fault, and the definition of the fault location is carried out only if a ground fault relating to the line has been detected.

In this way, the fault location method is carried out, in a manner of speaking, in two steps. In a first step, the mere presence of a ground fault is initially identified. The fault location is started in a second step only if such a fault has been detected. The overall processing cost can thus be minimized, since the fault location is instigated only on demand.

In this context, it can specifically be provided that the presence of a ground fault is detected if a jump which exceeds a predefined threshold has been identified in the characteristic of the current and voltage values or values derived therefrom, or if a behavior of a zero-sequence current sum and a displacement voltage of a characteristic of a ground fault occurs.

Jump detections and the wattmetric method in which an evaluation of the zero-sequence current sum and the displacement voltage takes place are conventional ground fault detection methods for isolated or suppressed networks and are sufficiently known to the person skilled in the art. In this context, a direction detection also takes place in order to clearly identify the fault-affected line section. The fault location can then be carried out for the fault-affected section only. A method known per se based on the reactive power (ungrounded neutral point) or active power (compensated neutral point) can be used, or the power direction can be formed from results of a Fourier transformation through multiplication of the voltage indicators with the complex-conjugate current indicators. A fault location is appropriate if a forward-oriented fault direction has been detected.

According to one further advantageous embodiment of the method according to the invention, it can finally be provided that, in the case of a line in the form of a cable made up of a plurality of segments, the connection point between two segments of the cable which is closest to the fault location defined in the optimization of the target function is defined as the actual fault location of a self-extinguishing ground fault.

In this way, the fault location can be carried out even more precisely in the case of a self-extinguishing ground fault by using additional knowledge of the fault-affected line. Specifically in the case of underground cables, it is in fact particularly advantageous to be able to locate the position at which the underground cable has to be excavated as precisely as possible in order to minimize the structural work required. Since a self-extinguishing ground fault can occur in underground cables in principle only at the connection point (joint) of two cable segments, the precise fault location can be correspondingly clearly identified with knowledge of the position of the joints along the cable route.

The aforementioned object is also achieved by a device for determining the fault location of a ground fault relating to a line of a three-phase electrical energy supply network with an ungrounded neutral point, with a processing device which is configured, following the occurrence of a fault on the line, to define the fault location of said fault using first current and voltage values measured at one line end of the line.

It is provided according to the invention that the processing device is configured to convert the measured current and voltage values using a Clarke transformation into α-components and 0-components of the Clarke transformation, the processing device is configured to define a location-dependent characteristic function of α-component fault voltage values using the current and voltage values converted into the α-component and a propagation model for travelling waves on the line, the processing device is configured to define a location-dependent characteristic function of 0-component fault voltage values using the current and voltage values converted into the 0-component and a propagation model for travelling waves on the line, the processing device is configured to determine the matching of the two characteristic functions for different selected locations on the line, and the processing device is configured to define the selected location where the two characteristic functions reveal the closest match as the actual fault location of the ground fault on the line.

With regard to the device according to the invention, all details described above and below for the method according to the invention and vice versa apply accordingly, in particular the device according to the invention is configured to carry out the method according to the invention in any given embodiment or a combination of any given embodiments. In respect of the advantages of the device according to the invention, reference is also made to the advantages described in relation to the method according to the invention.

Specifically, it can be provided according to one advantageous embodiment of the device according to the invention that the device is an electrical protection device. Here, the device may advantageously be formed by an electrical protection device which, along with the fault location, performs further protection and monitoring functions for the electrical energy supply network (e.g. a distance protection function, an overcurrent protection function or a differential protection function for the line). Alternatively, however, it may also be provided that the device is a separate fault-localizing device.

Other features which are considered as characteristic for the invention are set forth in the appended claims.

Although the invention is illustrated and described herein as embodied in a method and device for determining the fault location of a ground fault relating to a line of a three-phase electrical energy supply network having a neutral point without low-resistance grounding, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
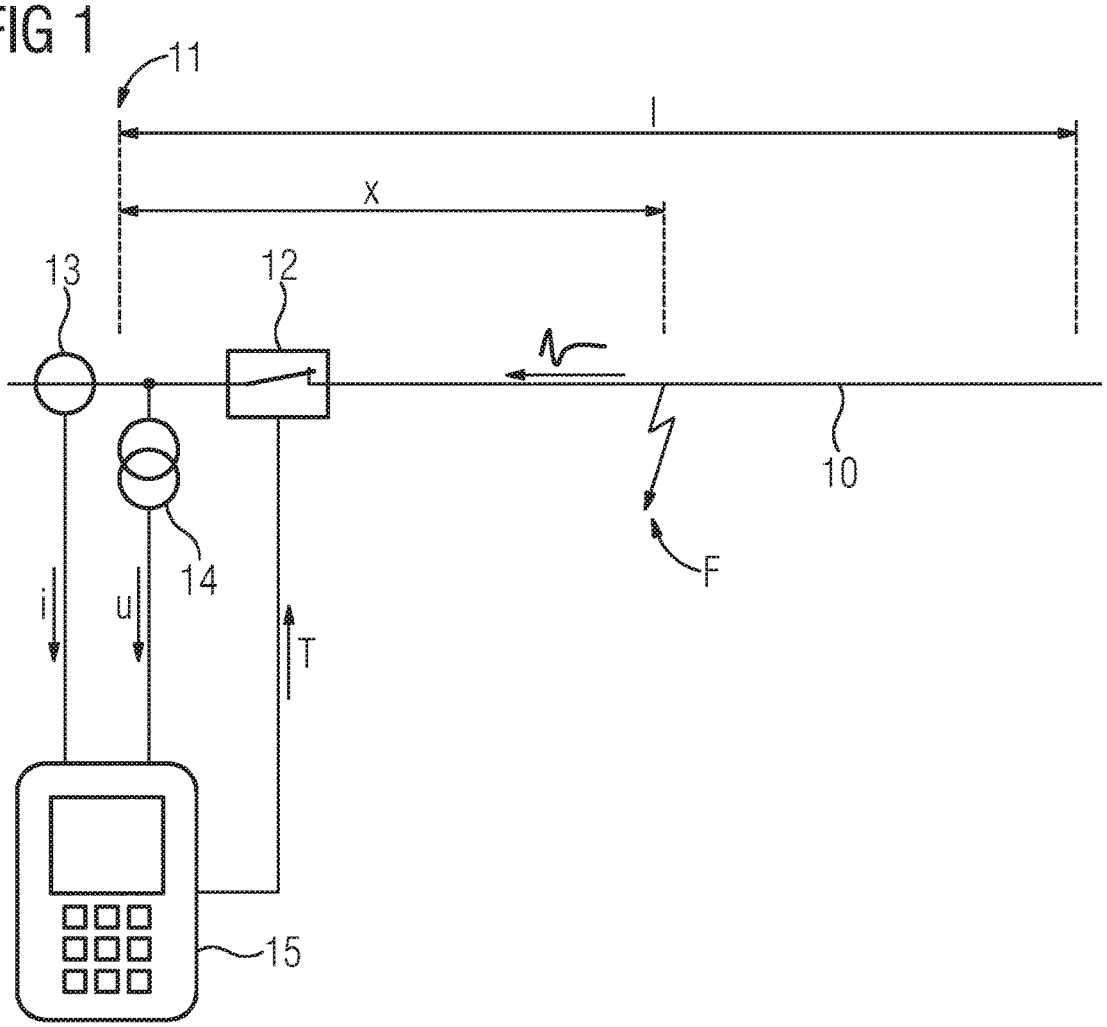
FIG. 1 shows a schematic view of a line of an energy supply network with a device for determining a fault location.

Referring now to the figures of the drawing in detail and first, particularly, to FIG. 1 thereof, there is shown an electrical line 10 of an energy supply network in a simplified single-phase representation. The energy supply network is actually a three-phase energy supply network which has a neutral point that is not effectively grounded, i.e. is operated with an isolated or compensated neutral point. The line 10 has a length l.

The line 10 is limited at its one line end 11 by a power switch 12 and can be disconnected by the latter from the remaining energy supply network. A measuring point at which current and voltage measured values can be measured with current transformers 13 and voltage transformers 14 shown in FIG. 1 merely by way of example is furthermore provided at the line end 11. The current transformers 13 and the voltage transformers 14 may be conventional or unconventional transformers. Current measured values i and voltage measured values u, which may be analog or digitized values, are output by the transformers on the secondary side.

A device 15 for determining a fault location is connected at the line end 11 to the current transformers 13 and the voltage transformers 14. The devices 15 may, for example, be an electrical protection device which, as well as a fault location function, can perform other protection and monitoring functions also. A protection device of this type monitors the operating state of the line 10 using the recorded current and voltage measured values and, in the event of a fault, transmits a shutdown signal T to the power switch 12 in order to cause the latter to open its switching contacts.

If the fault is a simple ground fault, a shutdown of the line is not yet necessary in an energy supply network with an isolated or compensated neutral point, since the flowing fault current is very low due to the lacking grounding. The determination of the fault location is nevertheless necessary in order to avoid an escalation of the fault. The device 15 is therefore configured, in the event of a ground fault on the line 10, to determine and output the fault location, i.e. the location on the line at which the ground fault has occurred. To do this, it uses the current and voltage measured values which have been measured during the fault.

The device 15 carries out a fault location (i.e., fault localization) according to the travelling wave principle. This exploits the fact that, in the event of a fault, high-frequency transient signal components occur in the current and in the voltage which propagate roughly at the speed of light on an overhead line 10 (in lines in the form of cables, the propagation speed is lower, roughly half as fast). This is indicated by way of example in FIG. 1. For this purpose, it is assumed that a fault has occurred at a fault location F. The travelling waves propagate as shown from the fault location F and can be measured at the line end with the transformers 13, 14 and can be evaluated with the device 15 for the fault location definition. As seen from the line end, the fault location F is located at a distance x. The device evaluates the current and voltage measured values as described in detail below and outputs the fault location F, for example as a distance or as a percentage of the line length l.

The operator of the energy supply network can forward the determined fault location F to a maintenance team which can then visit the fault location and eliminate the cause of the fault. The most accurate possible determination of the fault location is required for this purpose. A fault location method is described below which manages solely with the measured values at one line end.

A brief explanation of the principle of travelling wave fault location will first be given. A propagation model for travelling waves along the line 10 is used.

The "theory of long lines" is used to produce the algorithm concerned. This involves the model-based mapping of an electrical line in the form of "distributed parameters". This is shown by way of example in FIG. 2.

Figure 2:
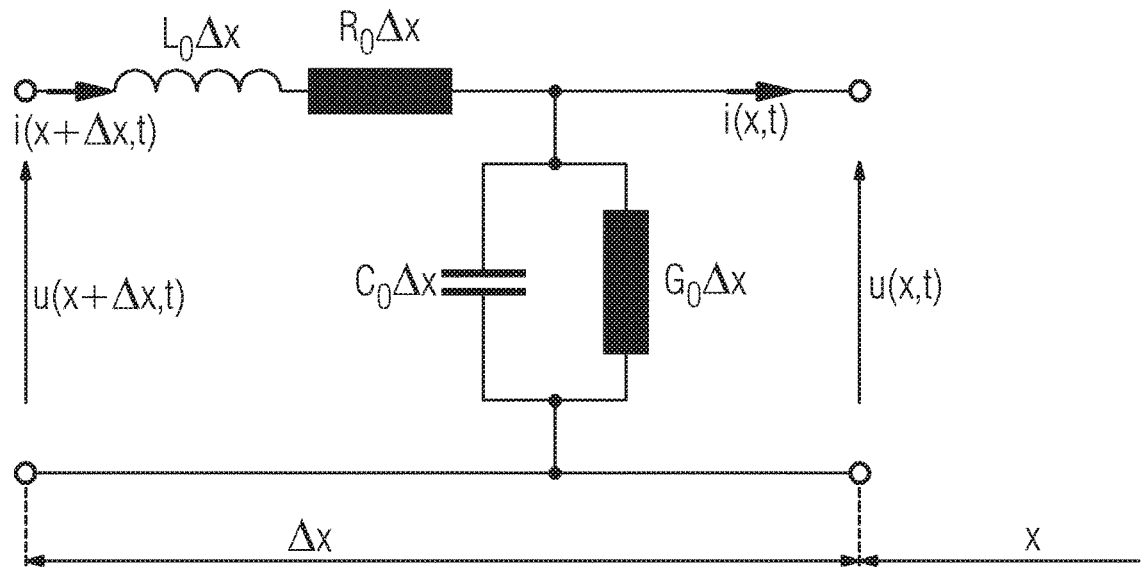
FIG. 2 shows a representation of the electrical parameters of a line section Δx to explain the definition of a fault location according to the travelling wave principle.

FIG. 2 shows that the network parameters such as the inductance per unit length $L_0$, capacitance per unit length $C_0$, resistance per line length $R_0$ and conductivity per unit length $G_0$ are distributed along the line. On the basis of this line model, using Kirchhoff's laws for the section $\Delta x$ of the line, the following equations are obtained for the voltage u and the current i:

$$u(x+\Delta x, t) = R_0 \Delta x \cdot i(x+\Delta x, t) + L_0 \Delta x \frac{\partial i(x+\Delta x, t)}{\partial t} + u(x, t) \quad (1)$$

$$i(x+\Delta x, t) = G_0 \Delta x \cdot u(x, t) + C_0 \Delta x \frac{\partial u(x, t)}{\partial t} + i(x, t) \quad (2)$$

Through mathematical transformations, equations (1) and (2) can be converted into the following form:

$$\frac{\partial u(x, t)}{\partial x} = R_0 \cdot i(x, t) + L_0 \frac{\partial i(x, t)}{\partial t} \quad (3)$$

$$\frac{\partial i(x, t)}{\partial x} = G_0 \cdot u(x, t) + C_0 \frac{\partial u(x, t)}{\partial t} \quad (4)$$

These equations (3) und (4) are partial differential equations of a homogeneous line and are normally referred to as "telegraph equations". They can be generalized to apply to any given conductors.

By considering equations (3) and (4) in the Laplace domain, assuming x as a parameter, many effects occurring in the line can be interpreted substantially more simply:

$$\frac{\partial u(x, s)}{\partial x} = R_0 \cdot i(x, s) + sL_0 \cdot i(x, s) \quad (5)$$

$$\frac{\partial i(x, s)}{\partial x} = G_0 \cdot u(x, s) + sC_0 \cdot u(x, s) \quad (6)$$

The derivatives of equations (5) und (6) according to parameter x produce following:

$$\frac{\partial^2 u(x, s)}{\partial x^2} = Z(s)Y(s) \cdot u(x, s) \quad (7)$$

$$\frac{\partial^2 i(x, s)}{\partial x^2} = Y(s)Z(s) \cdot i(x, s) \quad (8)$$

Equations (7) and (8) can be solved separately using the differential equation theory for voltage and current:

$$U(x) = e^{-\gamma(s)x} \cdot A_1 + e^{\gamma(s)x} \cdot A_2 \quad (9)$$

$$Z_c(s) \cdot I(x) = e^{-\gamma(s)x} \cdot A_1 - e^{\gamma(s)x} \cdot A_2 \quad (10)$$

In solving equations (9) und (10), it is possible to calculate the unknown parameters $A_1$ and $A_2$ from the initial conditions:

$$A_1 = \tfrac{1}{2}(U_1(s) + Z_c(s) \cdot I_1(s)) \quad (11)$$

$$A_2 = \tfrac{1}{2}(U_1(s) - Z_c(s) \cdot I_1(s)) \quad (12)$$

where $U_1$ and $I_1$ represent the initial conditions with x=0. In addition, equations (9) and (10) contain a wave impedance $Z_c$ and the propagation constant $\gamma$ which can be calculated from the line parameters:

$$\gamma(s)^2 = Z(s)Y(s) \quad (13)$$

$$Z_c(s) = \gamma(s)^{-1} \cdot Z(s) \quad (14)$$

Here, Z represents the line impedance and Y the shunt admittance of a section of the line. The values are indicated in each case in relation to length.

The following forms are thus obtained for equations (9) and (10):

$$U(x,s) = \tfrac{1}{2}e^{-\gamma(s)x} \cdot (U_1(s) + Z_c(s) \cdot I_1(s)) + \tfrac{1}{2}e^{\gamma(s)x} \cdot (U_1(s) - Z_c(s) \cdot I_1(s)) \quad (15)$$

$$Z_c(s) \cdot I(x,s) = \tfrac{1}{2}e^{-\gamma(s)x} \cdot (U_1(s) + Z_c(s) \cdot I_1(s)) - \tfrac{1}{2}e^{\gamma(s)x} \cdot (U_1(s) - Z_c(s) \cdot I_1(s)) \quad (16)$$

Equations (15) and (16) represent a voltage-related and current-related propagation model for travelling waves along the line 10. For the travelling wave fault location described below, the fault voltage at the initially unknown fault location F is considered. The relation described in equation (15) is used here.

This voltage equation (15) can be represented in the following form in the Laplace domain:

$$U(x,s) = U_1(s)\cos h\gamma(s)x - Z_c(s) \cdot I_1(s)\sin h\gamma(s)x \quad (17)$$

The transition to the frequency domain is effected by inserting $s = j\omega$, where the angular frequency is represented as follows:

$$U(x,j\omega) = U_1(j\omega)\cos h\gamma(j\omega)x - Z_c(j\omega) \cdot I_1(j\omega)\sin h\gamma(j\omega)x \quad (18)$$

This produces the analytical equation (18), which is satisfied for each occurring frequency $f = \omega/2\pi$. For this reason, the consideration can be limited to a selected frequency spectrum.

Transients in the range from a few hundred Hertz to a few Kilohertz are used in the fault location method described below. The frequency range is selected according to the following criteria:

The selected frequency band must be in the transmission range of the primary transformers 13, 14;

The selected frequency band must cover a range in which the transients occurring in the event of a ground fault have the highest possible energy content.

Figure 3:
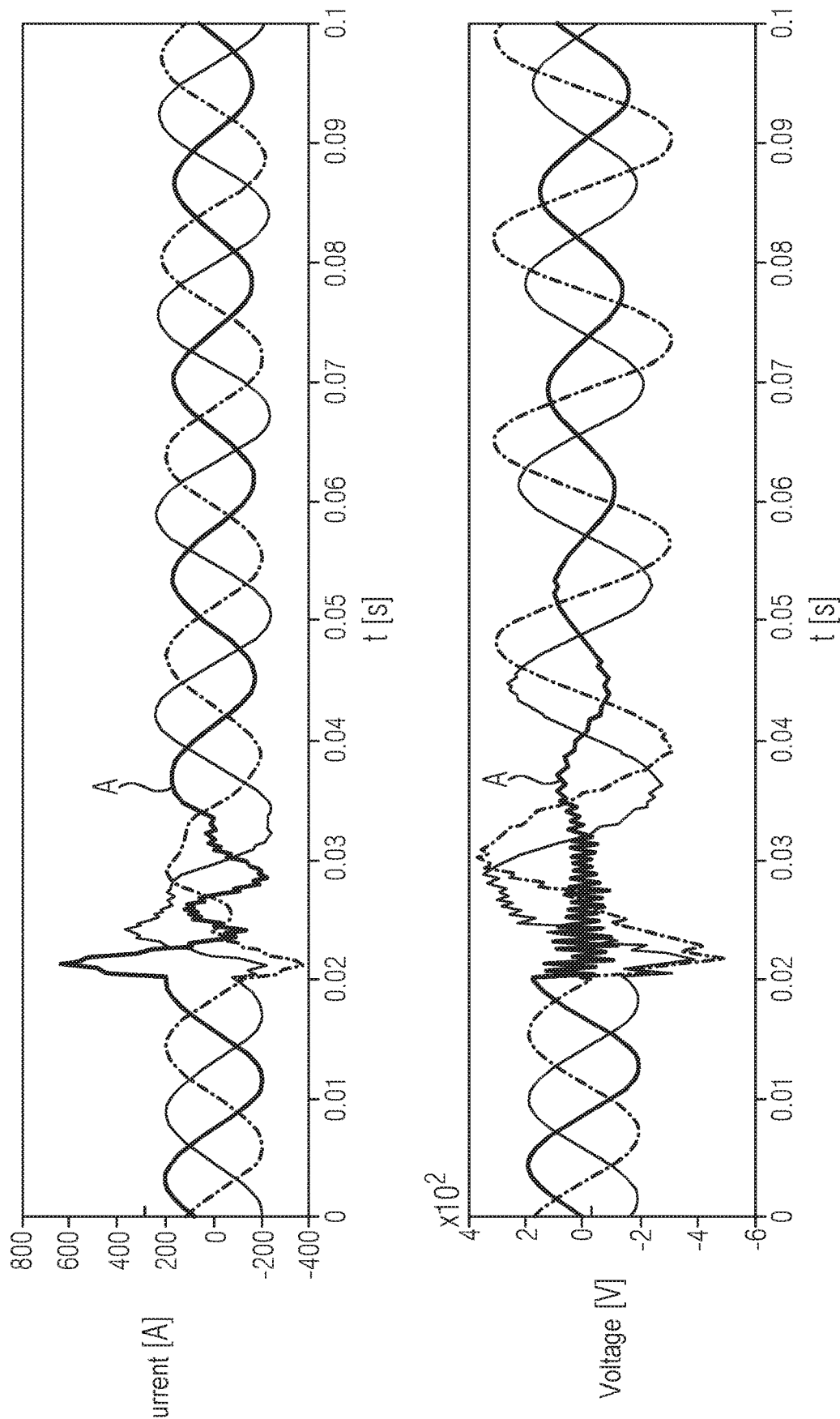
FIG. 3 shows examples of characteristics of current and voltage measured values.

FIG. 3 shows characteristics of current and voltage values in the time domain in the case of a single-phase ground fault in phase A. The ground fault shown in FIG. 3 causes only minor changes in the currents at the rated frequency. The voltage in phases B and C increases in each case by the factor $\sqrt{3}$. Transients which are used in the proposed fault location method can be observed in the current and voltage signals.

In this context, the frequency components above the rated frequency caused by the fault occurrence can be clearly seen in FIG. 3. If a frequency analysis is carried out, the spectral components with the greatest energy content are found to occur in the range up to a few Kilohertz (typically e.g. up to 15 kHz). The energy content of the transients decreases continuously toward higher frequencies. Typical medium voltage-current transformers transmit a frequency range up to around 10-20 kHz. The frequency range selected according to these criteria is band-limited by means of a filter (passband of a low-pass filter e.g. 0 kHz to 15 kHz). Through the use of the low-pass filter, the transients can be sampled with a sampling system and can be used for the ground fault location. They represent a pattern which differs for each fault position and is dependent on the characteristics of the network.

It is furthermore clearly evident that a ground fault location according to conventional impedance-based methods cannot readily be performed on the basis of the characteristic of the signals. A transient ground fault is furthermore present only for a duration of around 13 ms. In this time segment, the signals are so impaired that a definition of the fundamental wave indicator would result in very substantial measurement errors. It should furthermore be noted in the case of these signals that the phases unaffected by a fault also have transients.

Since the energy supply network is a three-phase network in the present case, it is necessary to present the equation (18) given above in the form of a matrix. An equation system of this type can be simplified by means of a modal or eigenvalue transformation. This enables the individual equations of the resulting equation system to be decoupled from one another and thus to be considered independently from one another. In addition, this transformation enables the equations already obtained to be considered in transformed components.

By way of example, a simple symmetrical line having the following parameters for a rated frequency of 60 Hz will be considered below:

$$Z = \begin{bmatrix} 0.187 + j0.858 & 0.098 + j0.3705 & 0.098 + j0.3705 \\ 0.098 + j0.3705 & 0.187 + j0.858 & 0.098 + j0.3705 \\ 0.098 + j0.3705 & 0.098 + j0.3705 & 0.187 + j0.858 \end{bmatrix} \Omega \quad (19)$$

$$Y = 1e - 5 \begin{bmatrix} j0.3 & -j0.036 & -j0.036 \\ -j0.036 & j0.3 & -j0.036 \\ -j0.036 & -j0.036 & j0.3 \end{bmatrix} S \quad (20)$$

Here, Z represents the line impedance and Y the line admittance. The Clark transformation is used as the modal transformation for decoupling. This has a transformation matrix T as follows; this produces $\alpha$, $\beta$ and 0 components:

$$T = \frac{2}{3}\begin{bmatrix} 1 & -0.5 & -0.5 \\ 0 & \frac{\sqrt{3}}{2} & -\frac{\sqrt{3}}{2} \\ 0.5 & 0.5 & 0.5 \end{bmatrix} \quad (21)$$

The aforementioned matrices (19) and (20) can be transformed with the Clark transformation as follows:

$$Z_{\alpha\beta 0} = \quad (22)$$

$$TZT^{-1} = \begin{bmatrix} 0.0894 + j0.487 & 0 & 0 \\ 0 & 0.0894 + j0.487 & 0 \\ 0 & 0 & 0.383 + j1.599 \end{bmatrix} \Omega$$

$$Y_{\alpha\beta 0} = TYT^{-1} = 1e^{-5} \begin{bmatrix} j0.336 & 0 & 0 \\ 0 & j0.336 & 0 \\ 0 & 0 & j0.229 \end{bmatrix} S \quad (23)$$

In conjunction with equations (13) and (14), this produces the three propagation constants (equation (24)) and wave impedances (equation (25)) which are to be considered:

$$\gamma_{\alpha\beta 0} = \begin{bmatrix} 0.0001 + j0.00128 & 0 & 0 \\ 0 & 0.0001 + j0.00128 & 0 \\ 0 & 0 & 0.0002 + j0.0019 \end{bmatrix} \quad (24)$$

$$Z_{C\alpha\beta 0} = \quad (25)$$

$$1e+2 \begin{bmatrix} 3.821 - j0.3475 & 0 & 0 \\ 0 & 3.821 - j0.3475 & 0 \\ 0 & 0 & 8.411 - j0.994 \end{bmatrix} \Omega$$

Along with the decoupling of the three-phase system, the Clark transformation is also used in the present case for the actual fault location. Every fault type can in fact be described mathematically in the modal space and can be represented accordingly in the form of an equivalent circuit diagram. A representation therefore exists for the ground fault in ungrounded networks also. This is shown by way of example in FIG. 4 for phase A of the energy supply network. Two blocks 41*a* and 41*b* and 42*a* and 42*b* are shown for the α-component ("α-mode") and for the 0-component ("0-mode"), in each case representing the line 10 and being interconnected at the fault location F. The remaining network is symbolized by blocks 41*c* and 42*c*.

Figure 4:
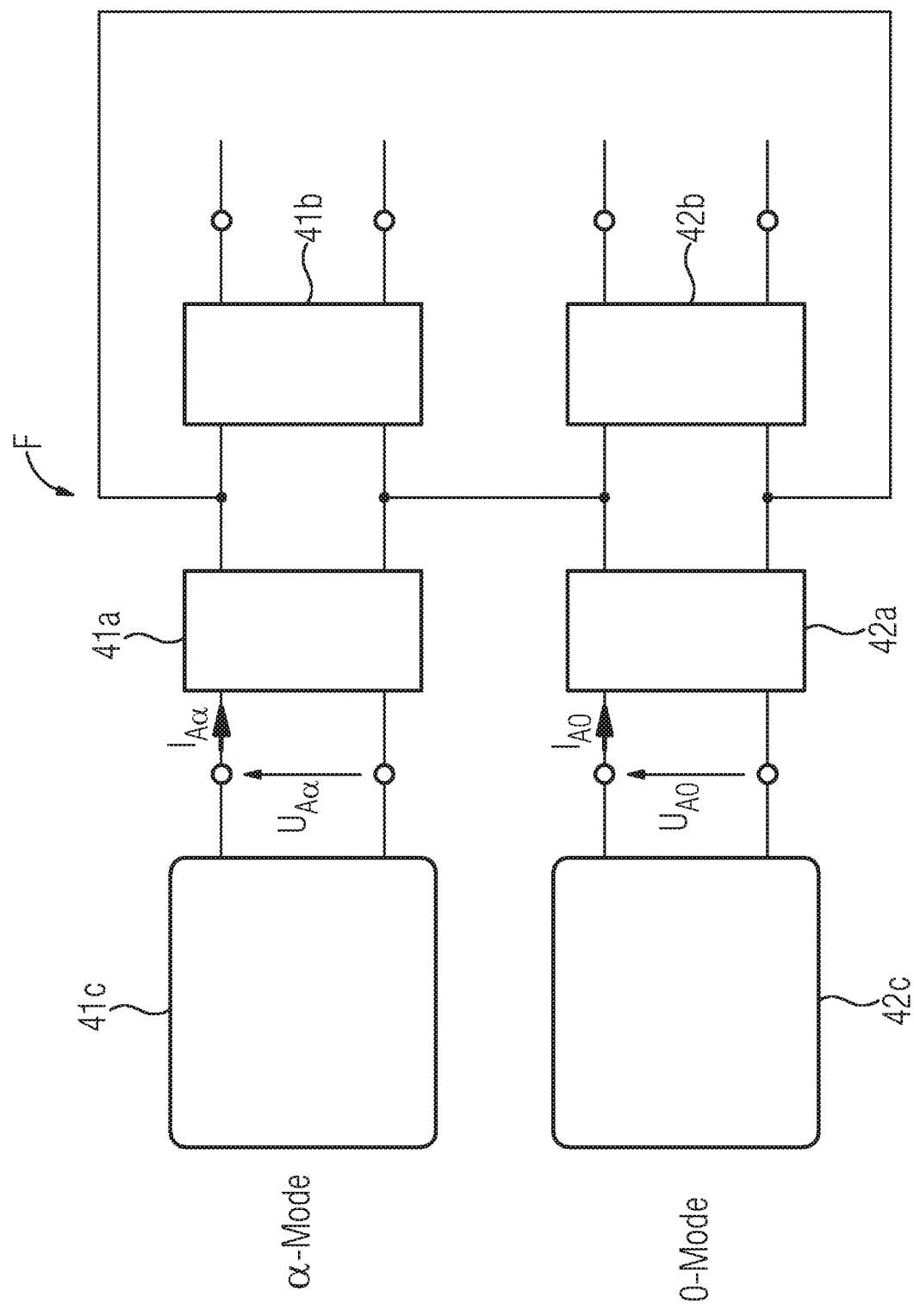
FIG. 4 shows an equivalent circuit diagram of a ground fault in the space of modal Clarke components.

It can be seen from FIG. 4 that the ground fault has an influence only on the α-component and the 0-component. The β-component, on the other hand, remains undisturbed and carries only the information relating to the load flow. This characteristic is used to identify the fault-affected phase, so that the fault location method can be used in a targeted manner for the fault phase. For every ground fault, the reference phase can be selected in such a way that the β-component is undisturbed. It is evident from FIG. 4 that the voltages in the 0-component and the α-component must be identical at the ground fault position (fault location F). In addition, the signals of the 0-component and the α-component have different propagation speeds $\gamma_0$ and $\gamma_\alpha$. These two characteristics are used for the ground fault location. At the measuring point 11, the two components are different and must, in a manner of speaking, be normalized to the correct fault location. This is carried out through the use of the telegraph equation in the frequency domain in the space of modal components. The characteristic of the two modal voltages in the 0-component and the α-component is dependent on the distance x. From equation (18) for the α-component and the 0-component (α-component fault voltage values according to equation (26) and 0-component fault voltage values according to equation (27)), this produces the following:

$$U_\alpha(x,j\omega) = U_{1,\alpha}(j\omega)\cos h\gamma_\alpha(j\omega)x - Z_{c,\alpha}(j\omega) \cdot I_{1,\alpha}(j\omega)\sin h\gamma_\alpha(j\omega)x \quad (26)$$

$$U_0(x,j\omega) = U_{1,0}(j\omega)\cos h\gamma_0(j\omega)x - Z_{c,0}(j\omega) \cdot I_{1,0}(j\omega)\sin h\gamma_0(j\omega)x \quad (27)$$

Figure 5:
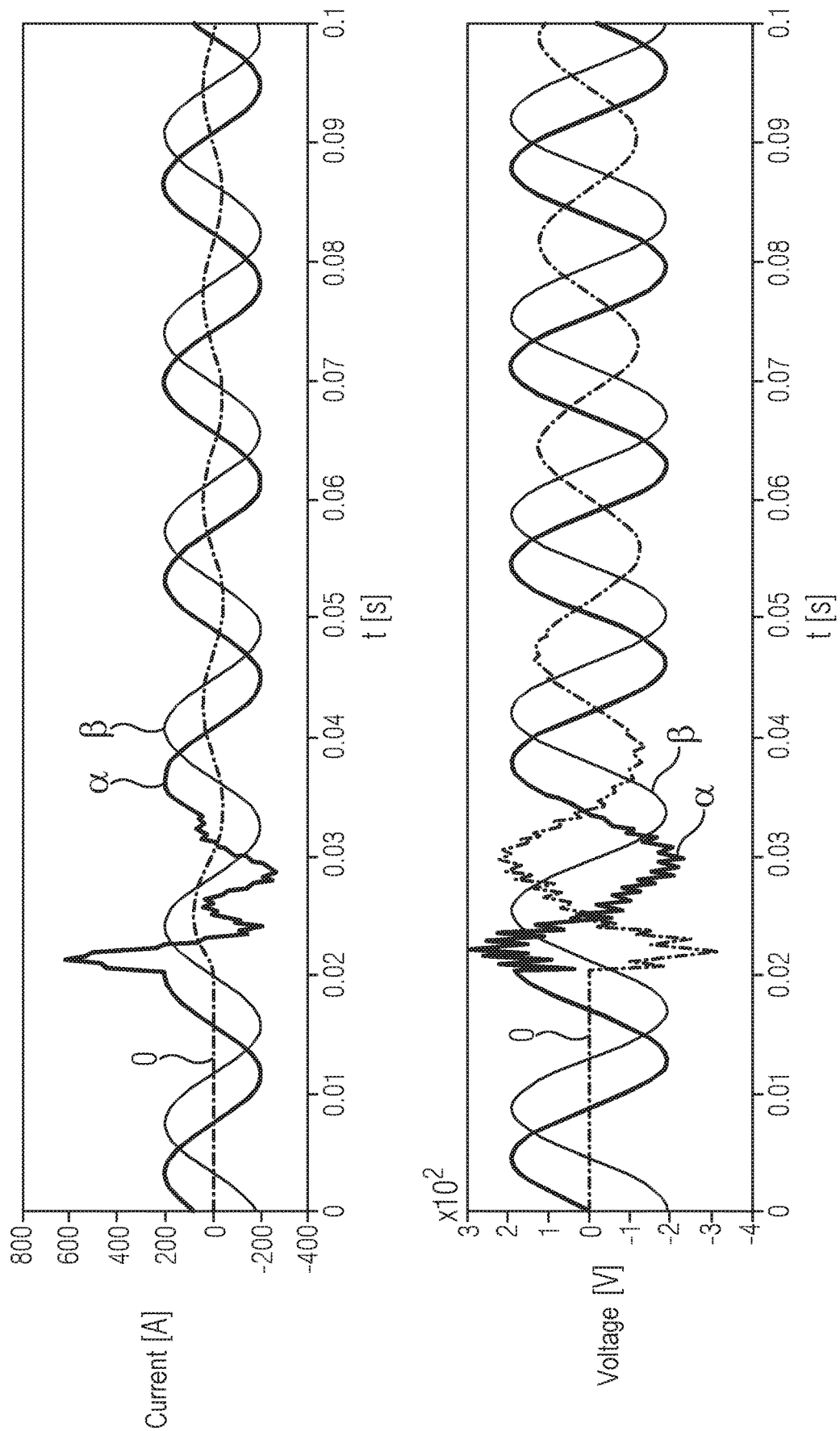
FIG. 5 shows examples of characteristics of Clark-transformed current and voltage measured values.

FIG. 5 shows by way of example the characteristics of the α-component and the 0-component following the Clark transformation of the current and voltage values from FIG. 3. The reflections occurring during the ground fault produce the transients which are then used to identify the ground fault location. These transients can be measured in a brief time window, the duration of which is significantly less than one cycle duration of the fundamental wave. Herein lies an essential advantage of the proposed fault location method. In most cases, the ground fault duration in overhead line systems is in fact less than one cycle and is difficult to identify with conventional methods.

Figure 6:
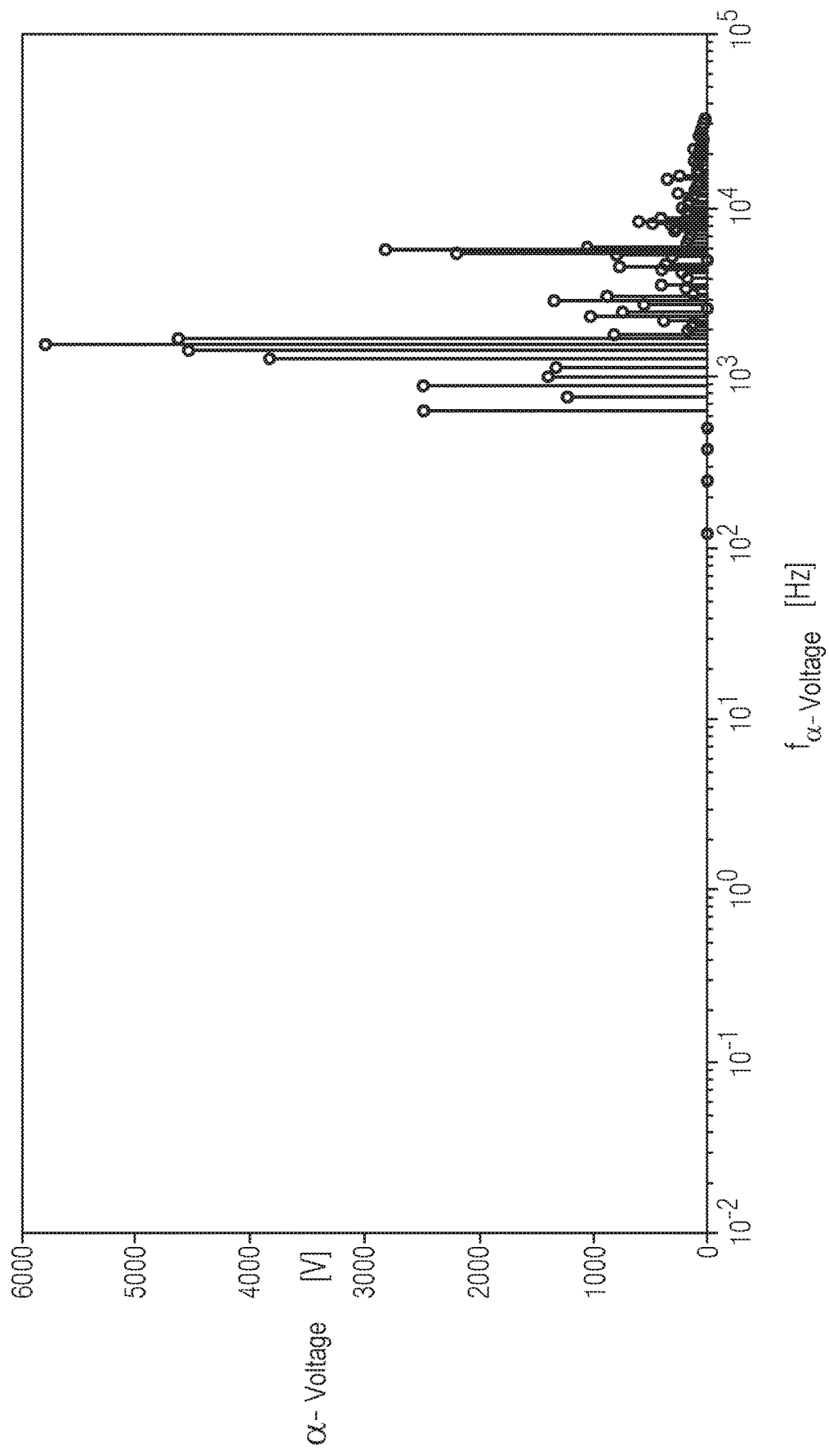
FIG. 6 shows an example of a frequency spectrum of an α-component of the Clarke transformation during a ground fault.
Figure 7:
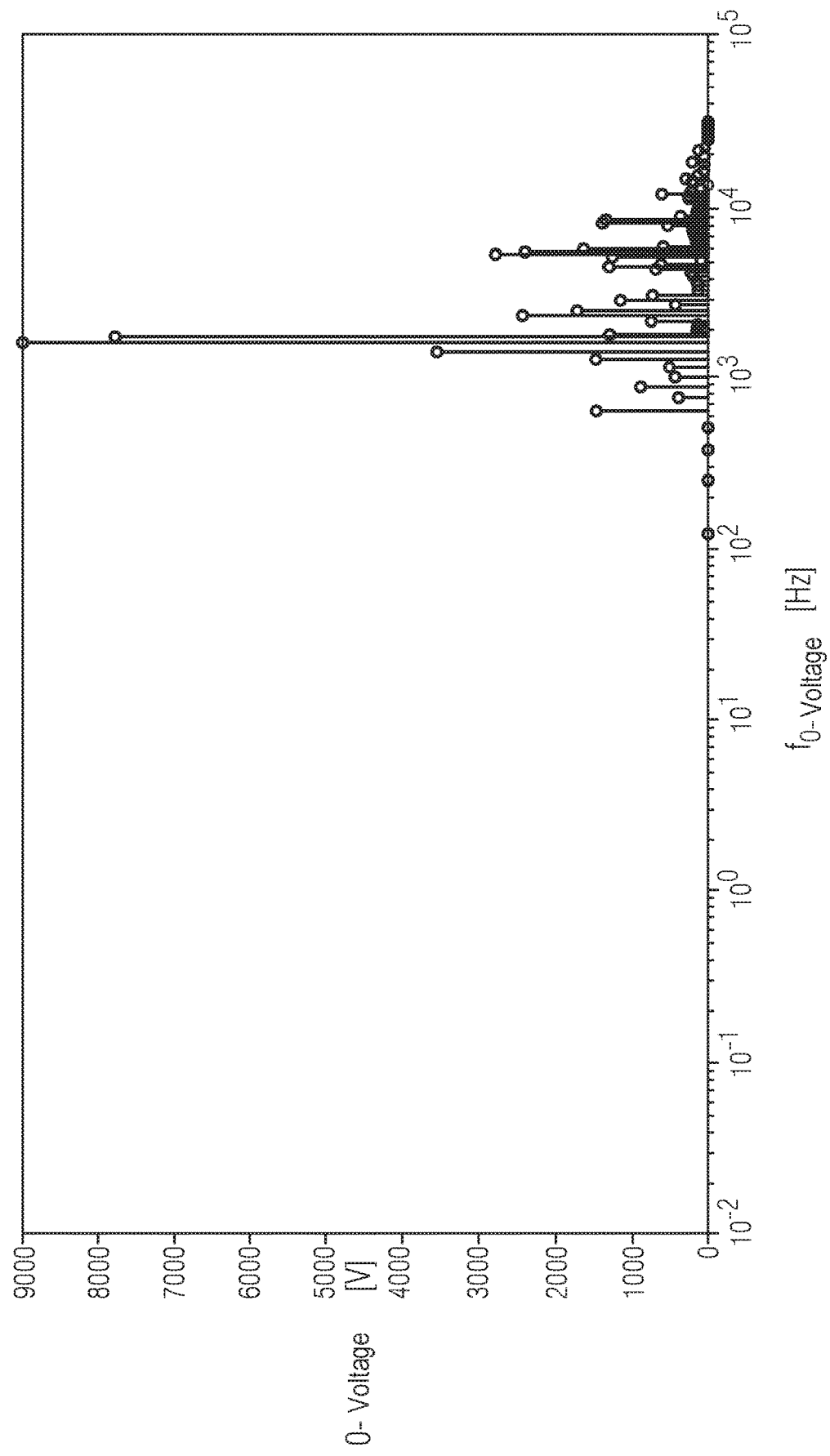
FIG. 7 shows an example of a frequency spectrum of an 0-component of the Clarke transformation during a ground fault.

FIGS. 6 and 7 show by way of example the spectra of the α-component and the 0-component of the voltage during the ground fault with a measurement window duration of half a cycle. Corresponding analyses can be carried out for the occurring currents. It is evident from FIGS. 6 and 7 that the transients are present in the signals with a sufficient amplitude (and therefore sufficient energy content). They are used for the ground fault location. The resonant frequencies, which are in the 1.5 kHz range, can be seen particularly clearly in the present example. Every ground fault is characterized by specific resonant frequencies which result from the network size, network parameters and the ground fault location. Since the resonant frequencies are not known in advance, the fault location is carried out in a frequency range which is significantly higher than the rated frequency of the energy supply network (e.g. 50 Hz or 60 Hz). In the present case, the frequencies below 600 Hz, for example, are not taken into account.

Figure 8:
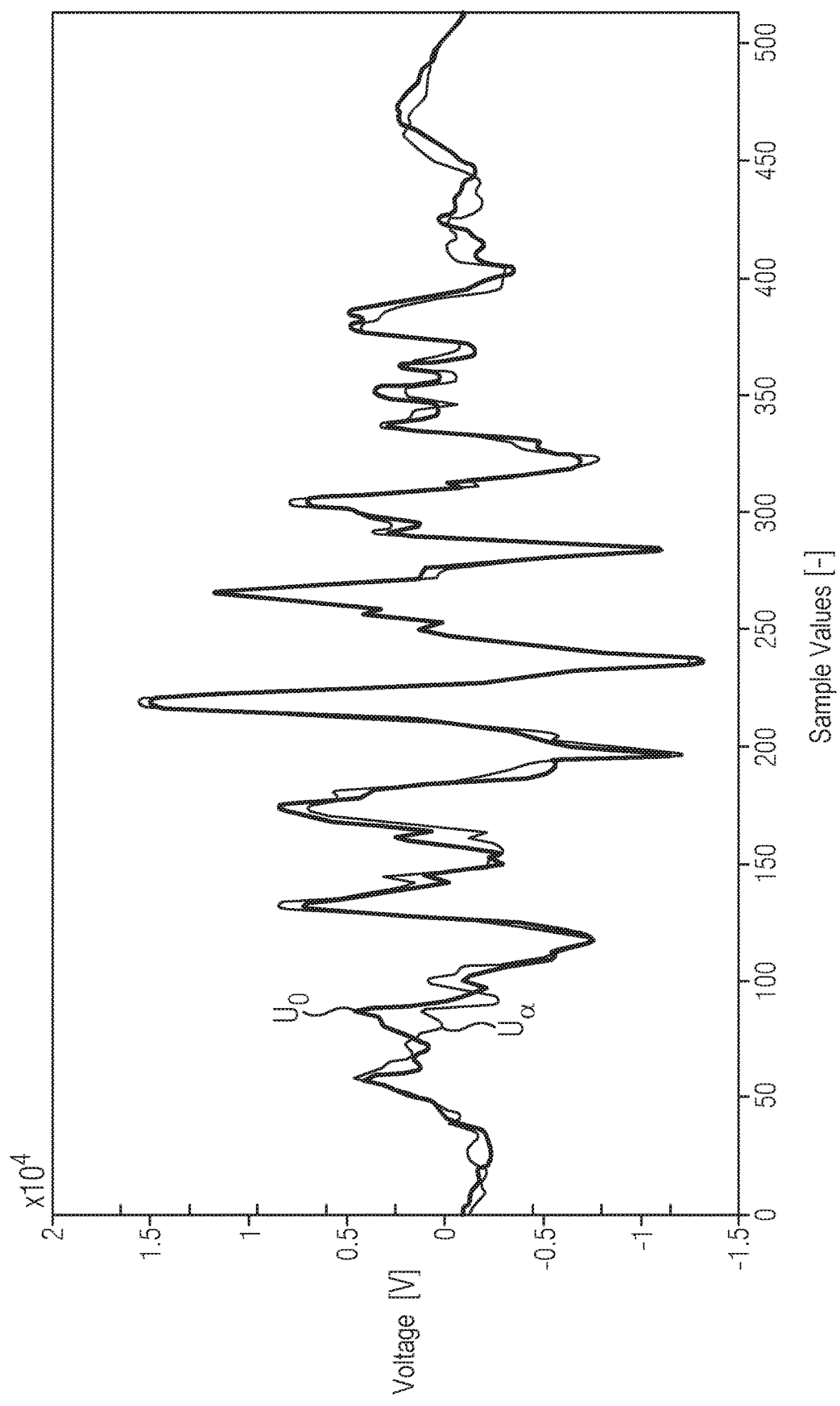
FIG. 8 shows examples of characteristic functions of the fault voltages of the 0-component and α-component for a selected location which corresponds to the actual fault location.
Figure 9:
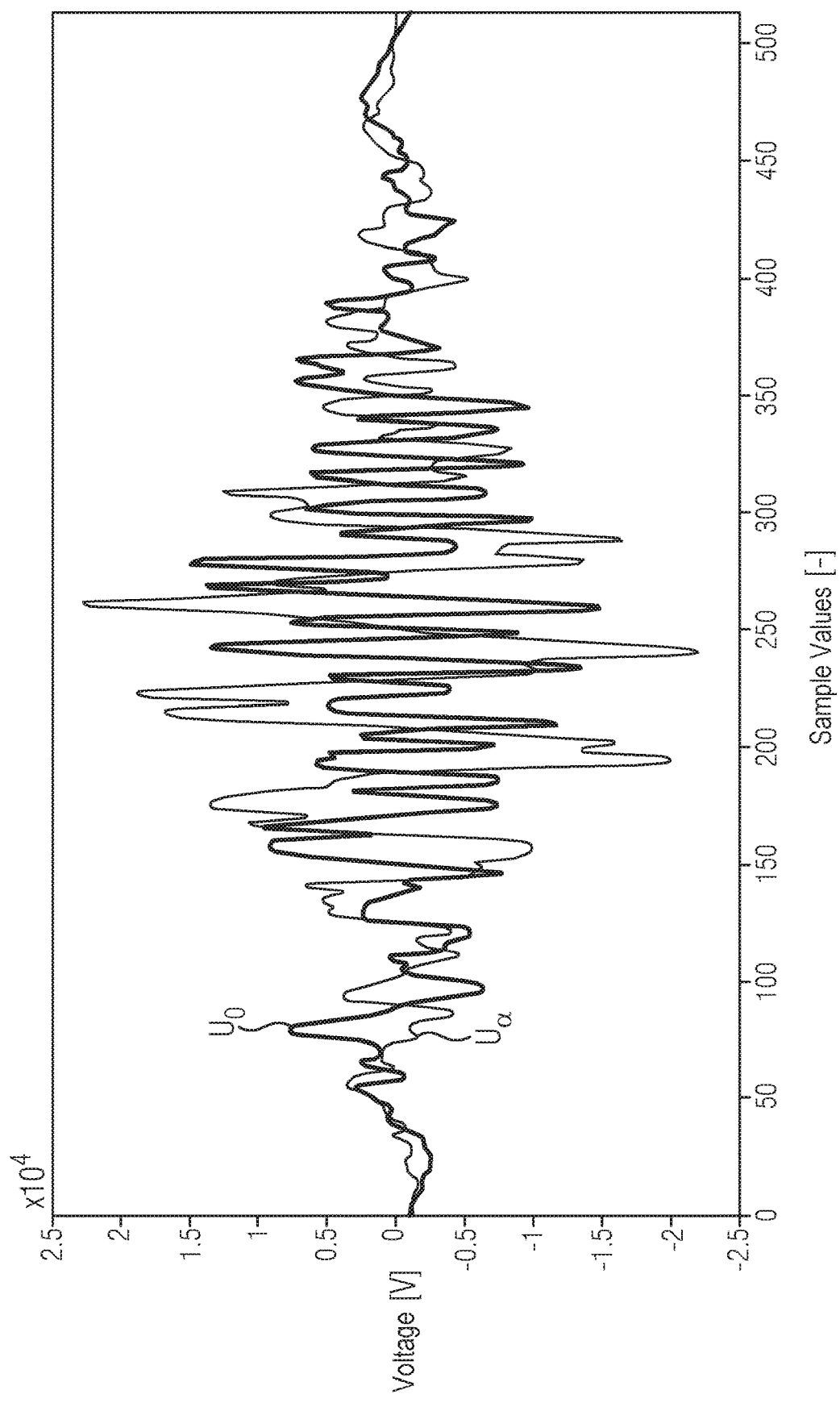
FIG. 9 shows examples of characteristic functions of the fault voltages of the 0-component and α-component for a selected location which does not correspond to the actual fault location.

The matching of the two modal components $U_\alpha$ and $U_0$ according to equations (26) and (27) takes place only at the fault position. The location x at which the characteristic functions (26) and (27) for the selected frequency range match one another must therefore be found. FIG. 8 shows by way of example the characteristic functions of the α-component fault voltage values according to equation (26) and the 0-component fault voltage values according to equation (27) for a location x which corresponds to the fault location. Conversely, FIG. 9 shows both characteristics for a location x which does not correspond to the fault location. An extensive match of the two characteristic functions is evident only in the case of FIG. 8 (correct fault location).

Figure 10:
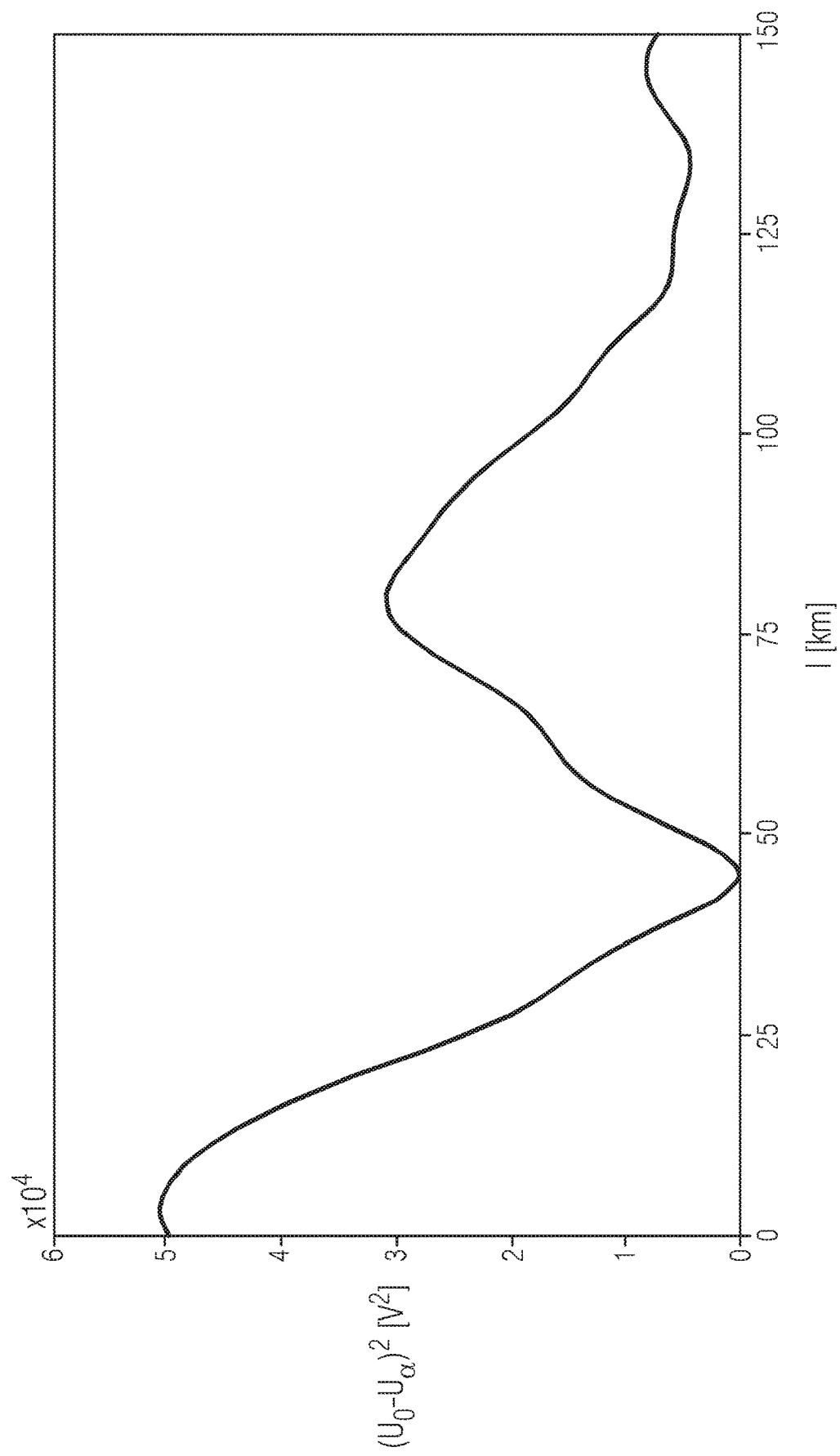
FIG. 10 shows an example of a characteristic of the target function for fault location.

It is evident from FIGS. 8 and 9 that the characteristic functions of the α-component fault voltage values according to equation (26) and the 0-component fault voltage values according to equation (27) reveal an extensive match only in the case of the correct fault location. If a location other than the fault location is selected, the two characteristic functions will not match one another. The correct fault location can therefore be determined with a selection of all possible locations along the equation and comparison of the respective match of the characteristic functions. For the mathematical performance of the search for the correct fault location, a target function can be produced which maps the difference between the two voltages. The characteristic of a target function of this type is also shown for the present case in FIG. 10. The quadratic deviation of the difference between the characteristic functions is selected here as the location-dependent target function ZF(x):

$$ZF(x) = (U_\alpha(x) - U_0(x))^2 \quad (28)$$

The global minimum of the target function identifies the ground fault location, here at the position x=45 km.

Figure 11:
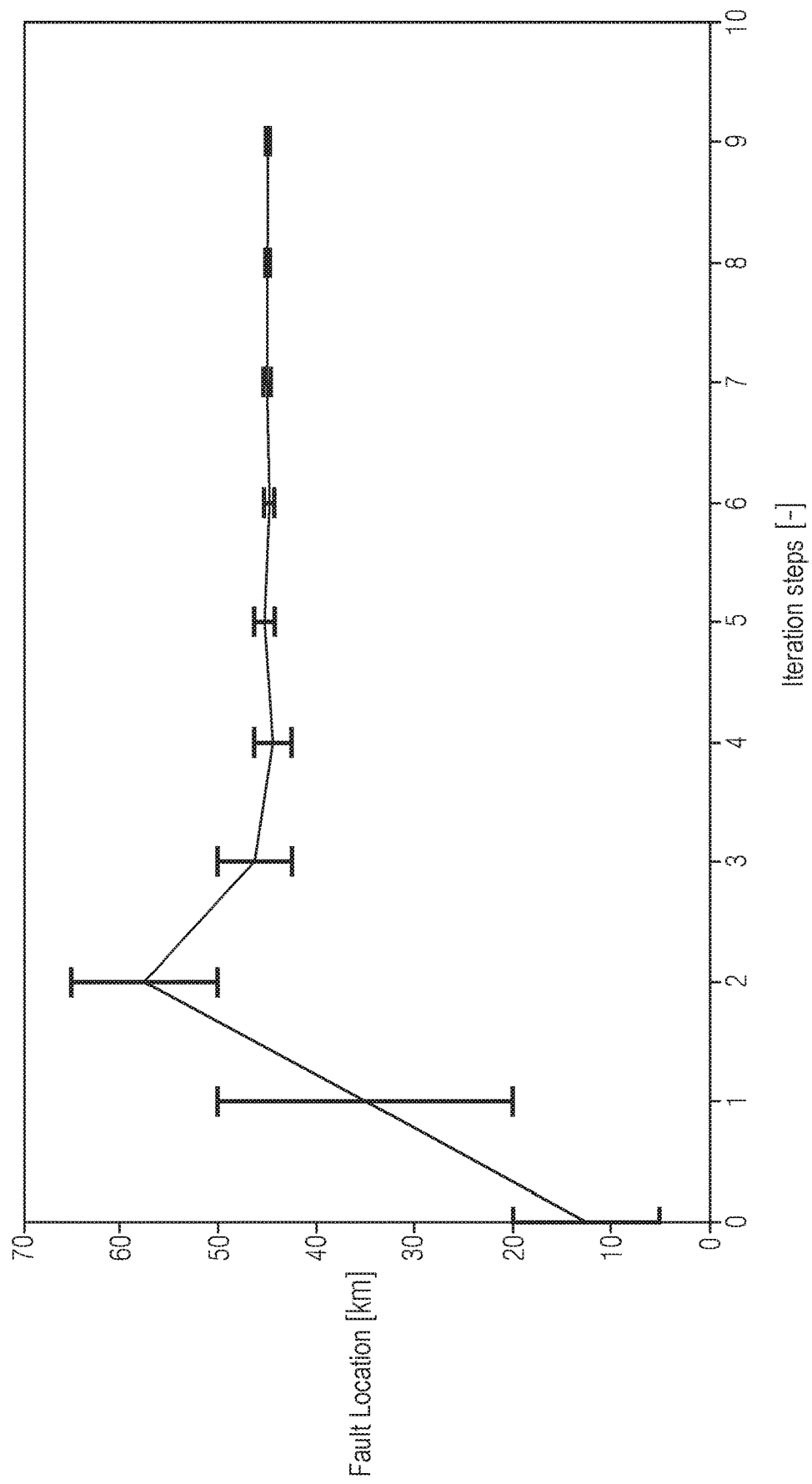
FIG. 11 shows an example of a characteristic of the convergence behavior of an iterative method for solving the target function.

The ground fault location can thus be calculated through minimization of the target function ZF(x). The search for the minimum can be carried out with different methods. Iterative methods for optimizing the target function are particularly suitable. According to one possible example embodiment, a simplex downhill method can be used which reveals a very good convergence behavior and requires no derivation of the target function according to the model parameters (x, jω). In the present example, the minimum is already achieved after a few steps. This is shown by way of example in FIG. 11.

If the energy supply network is (at least partially) a cable network and the ground fault is of the self-extinguishing type, the precision of the fault location can be further increased through additional knowledge of the installed lines. In cable networks, self-extinguishing ground faults in fact occur essentially only at the connection points (joints). If the cable network has joints of this type, this can be taken into account in the evaluation of the fault location by subdividing the cable into a plurality of cable segments. The cable segments are defined according to the position of the joints. In such cases, a transient ground fault can be assigned to the position of a joint, even if the calculated fault location is located only in the vicinity of the joint, by defining the location of the joint which is closest to the calculated fault location as the actual fault location.

Figure 12:
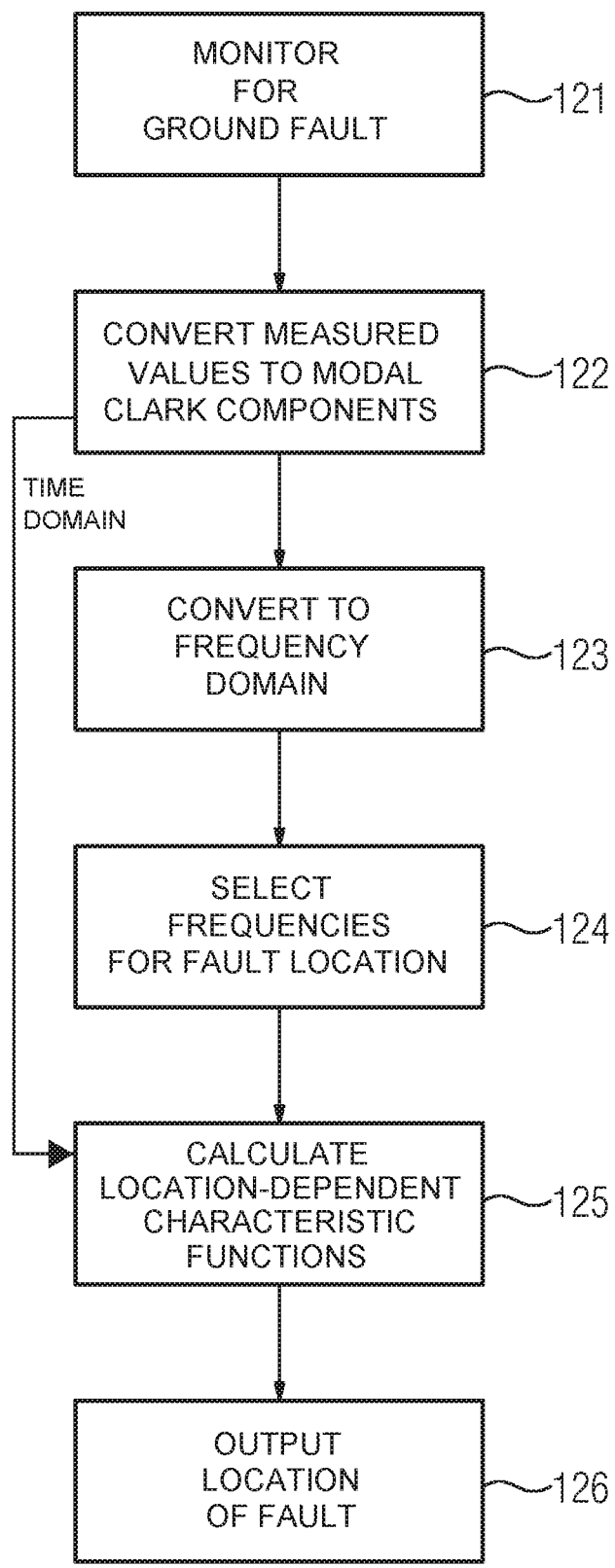
FIG. 12 shows a schematic view of a flow diagram to explain an example embodiment of a fault location method.

The fault location method for a ground fault in ungrounded networks is presented in summarized form in a flow diagram in FIG. 12. It should be noted here that not all method steps necessarily have to be present, but in some cases represent advantageous developments of the method.

A continuous monitoring of the energy supply network for the occurrence of a ground fault initially takes place in a first step 121. Current and voltage values are recorded and evaluated continuously at the measuring point for this purpose. A ground fault and its direction can be detected in a known manner, e.g. with a transient ground fault relay, a jump detection or the wattmetric method. If the current and voltage values do not indicate a fault, they are discarded or overwritten with new values in the ring memory operation. If a ground fault is detected, the current and voltage values are stored during the fault and preferably also for a certain time duration before and after the occurrence of the fault for further evaluation. This optional step 121 serves to initiate the actual fault location method only if a ground fault has in fact occurred. If a ground fault is detected in step 121, the method is continued in the following step 122; otherwise, the monitoring for a ground fault is continued in step 121.

In step 122, the measured current and voltage values are converted into modal Clarke components. The α-component and the 0-component of the current and voltage values are formed. The fault location takes place in modal Clarke components. According to the invention, the different propagation constant of a wave in the α-component and the 0-component is used to carry out a fault location.

A determination of the phase affected by the ground fault can optionally take place in this step 122. The β-component of the current and voltage values is additionally considered for this purpose. All three phases are taken as reference phases for this purpose. The reference phase defines the assignment of the parameters to the transformation matrix for the α-component, β-component and 0-component. The parameters of the Clarke transformation are normally represented in such a way that the reference phase is phase A. If the position of the parameters is changed, the reference phase can be shifted in any given manner. It is thus always favorable to select the reference phase in such a way that it corresponds to the ground fault phase. The reference phase at which the value of the β-component changes least compared with the preceding ground-fault-free state is therefore checked. This phase is considered as the phase affected by the ground fault. The reference phase for the Clarke transformation is thus selected in such a way that the amplitude of the β-component becomes zero. The α-component and the 0-component are formed with the reference phase defined in this way.

The α-component and the 0-component are then forwarded to the following step 123. If an evaluation of the phase affected by the ground fault has taken place, the information relating thereto is also forwarded to step 123.

A conversion of the Clarke-transformed temporal characteristics of the current and voltage values into the frequency domain can optionally take place in the following step 123, depending on the size of the measurement window. An FFT, for example, can be used for this purpose. Alternatively, the fault location can also take place in the time domain, in which case the method is continued after step 122 directly at step 125.

If a conversion into the frequency domain has taken place in step 123, the frequencies considered for the fault location are selected in step 124. Only frequencies above the network frequency are taken into account. Spectral components below the lowest resonance point are masked. The frequency resolution is dependent on the measurement data window. Only those transients are used which, on the one hand, lie in a frequency range which is transmitted error-free by the primary transformers and, on the other hand, contain a high energy proportion of the transients occurring during a ground fault. The components at the network frequency are suppressed in order to avoid an incorrect measurement due to load currents and asymmetries.

Location-dependent characteristic functions of the α-component fault voltage and the 0-component fault voltage are calculated in step 125 (equations (26) and (27)). A target function which is suitable for evaluating the matching of the characteristic function is formed with them. The transients used to form the characteristic functions also carry the pattern of the ground fault. The fault voltages in modal α-components and 0-components are formed from the measurement values at the measuring point at the line end by means of a line model at an assumed location x on the line. Since the α-components and the 0-components have different propagation speeds, a matching of the characteristic functions of the fault voltages is produced only for the actual fault location.

For example, the target function can describe the difference, preferably the squared difference (equation (28)), between 0-component and α-component fault voltages depending on the fault location. This function is optimized with a non-linear optimization method, e.g. the simplex downhill method, for searching for the location along the line at which the characteristic functions reveal the closest match.

Finally, in step 126, the location obtained in step 125 from the optimization is defined and output as the fault location. The output can take place e.g. locally on the device and/or can be forwarded as an electronic message to a control center.

The frequency-dependent amplitude and phase errors of the primary transformers can be taken into account in producing the target function.

If the line in the section on which the fault location has been identified is a cable line, the position of the fault can be identified even more precisely through additional information relating to the position of the connection points (joints) between individual cable segments. The position of a joint which is closest to the fault location calculated from the optimization is then used as the fault location.

The fault location method described above by way of example has substantial advantages compared with the prior art. On the one hand, a single-ended ground fault location can be carried out with the described method using the transients resulting from the ground fault process in the current and in the voltage. A synchronous measurement at both line ends and the transmission of the measured values to the respective opposite end are therefore no longer required here.

Compared with conventional fault location methods in which precise ground fault location is carried out with fundamental quantities consistent with a ground fault, ground faults of very short duration can also be located with the present method. The measurement window can in fact be reduced significantly by means of the proposed method. The calculation of the ground fault location is carried out with a very brief measurement window. The ground faults lasting less than one cycle duration can thus be identified and located.

Since the frequency of the transients occurring during the ground fault is not particularly high, the algorithm can be implemented in conjunction with conventional measuring techniques of the current and voltage transformers and can be integrated, for example, in a protection function of an existing protection device. Conventional transformers, e.g. protection transformers, can be used for the measurement.

A simplified model of a lossy line with frequency-independent parameters can be used as a line model for calculating the fault location, since non-linearities (skin effect) occur only far above the frequency band used for the fault location.

A further advantage of the method is that the result of the ground fault location is not significantly influenced by the load flow, even in the case of high-resistance ground faults.

Although the invention has been illustrated and described in detail above by means of preferred example embodiments, the invention is not limited by the disclosed examples and other variations may be derived herefrom by the person skilled in the art without exceeding the protective scope of the patent claims set out below.

The invention claimed is:

1. A method for determining the fault location of a ground fault relating to a line of a three-phase electrical energy supply network with an ungrounded neutral point, the method comprising:
measuring current and voltage values at a line end of the line;
determining, with a fault-localizing device disposed at the line end, whether a fault has occurred on the line using the measured current and voltage values, the fault-localizing device including a processor;
following an occurrence of a ground fault on the line, determining, with the fault-localizing device, a fault location of the ground fault by:
converting the measured current and voltage values using a Clarke transformation into α-components and 0-components of the Clarke transformation;
defining a location-dependent characteristic function of α-component fault voltage values using the current and voltage values converted into the α-component and a propagation model for travelling waves on the line;
defining a location-dependent characteristic function of 0-component fault voltage values using the current and voltage values converted into the 0-component and a propagation model for travelling waves on the line;
determining a matching of the two characteristic functions for different selected locations on the line; and
defining a selected location where the two characteristic functions exhibit a closest match as the fault location of the ground fault on the line; and
outputting the fault location of the ground fault at least one of: locally on the fault-localizing device; or as an electronic message sent from the fault-localizing device to a control center.

2. The method according to claim 1, which comprises determining the closest match of the two characteristic functions through an optimization of a target function, and thereby using the selected location on the line as an optimization variable for the target function.

3. The method according to claim 2, wherein the location for which a minimum of a difference between the two characteristic functions occurs is defined with the target function as the fault location.

4. The method according to claim 2, wherein, in the formation of the target function, frequency-dependent amplitude and/or phase angle errors can be taken into account by measuring transformers used to measure the current and voltage value.

5. The method according to claim 2, which comprises using an iterative optimization method for the optimization.

6. The method according to claim 5, which comprises using a simplex downhill method as the optimization method.

7. The method according to claim 1, which comprises:
converting the measured current and voltage values using the Clarke transformation into β-components of the Clarke transformation;
comparing the β-components of the current and/or voltage measured values of the individual phases with one another; and
determining the phase for which the β-components of the current and/or voltage measured values measured before the fault occurrence compared with the β-components of the current and/or voltage measured values measured after the fault occurrence exhibit a smallest change as being affected by the ground fault.

8. The method according to claim 7, which comprises defining the fault location only for a phase that is affected by the ground fault.

9. The method according to claim 1, which comprises:
subjecting the current and voltage measured values converted into the α-component and into the 0-component of the Clarke transformation to a transformation into a frequency domain; and
defining the fault location within a selected frequency range which is higher than a network frequency of the energy supply network.

10. The method according to claim 9, which comprises selecting a frequency range that comprises band-limited transient components of the α-component and the 0-component of the measured current and voltage values.

11. The method according to claim 10, wherein the frequency range lies between 600 Hz and 15 kHz.

12. The method according to claim 1, which comprises filtering the measured current and voltage values before performing the Clarke transformation, and thereby using a low-pass filter for filtering.

13. The method according to claim 1, which comprises:
continuously monitoring the line for an occurrence of a ground fault; and
defining the fault location only if a ground fault relating to the line has been detected.

14. The method according to claim 13, which comprises detecting a presence of a ground fault if a jump which exceeds a predefined threshold has been identified in the characteristic of the current and voltage values or values derived therefrom, or if a behavior of a zero-sequence current sum and a displacement voltage of a characteristic of a ground fault occurs.

15. The method according to claim 1, wherein the line is a cable made up of a plurality of segments and the method further comprises defining a connection point between two segments of the cable which is closest to the fault location defined in the optimization of the target function as the actual fault location of a self-extinguishing ground fault.

16. The method of claim 1, wherein the fault-localizing device is an electrical protection device configured to, in the event of a determination of a fault by the processor of the fault-localizing device, transmit a shutdown signal in order to shut down the line.

17. A device for determining a fault location of a ground fault relating to a line of a three-phase electrical energy supply network with an ungrounded neutral point, the device comprising:

a processing device which is configured to determine whether a fault has occurred, using first current and voltage values measured at an end of the line;

said processing device being configured to, following an occurrence of a fault on the line, define the fault location of the fault, using the first current and voltage values;

said processing device being configured to convert measured current and voltage values using a Clarke transformation into α-components and 0-components of the Clarke transformation;

said processing device being configured to define a location-dependent characteristic function of α-component fault voltage values using the current and voltage values converted into the α-component and a propagation model for travelling waves on the line;

said processing device being configured to define a location-dependent characteristic function of 0-component fault voltage values using the current and voltage values converted into the 0-component and the propagation model for travelling waves on the line;

said processing device being configured to determine a matching of the two characteristic functions for different selected locations on the line; and said processing device being configured to define the selected location where the two characteristic functions reveal a closest match as the fault location of the ground fault on the line; and said processing device being configured to output the fault location of the ground fault at least one of: locally on the device; or as an electronic message sent from the device to a control center.

18. The device of claim 17, wherein said device is an electrical protection device configured to, in the event of a determination of a fault by said processing device, transmit a shutdown signal in order to shut down the line.

* * * * *